(12) United States Patent
Shibahara et al.

(10) Patent No.: US 7,898,240 B2
(45) Date of Patent: Mar. 1, 2011

(54) CURRENT MEASURING APPARATUS

(75) Inventors: Koji Shibahara, Machida (JP); Osamu Matsumoto, Fuji (JP)

(73) Assignee: Asahi Kasei EMD Corporation, Tokyo (JP)

( * ) Notice: Subject to any disclaimer, the term of this patent is extended or adjusted under 35 U.S.C. 154(b) by 232 days.

(21) Appl. No.: 11/884,875

(22) PCT Filed: Feb. 23, 2006

(86) PCT No.: PCT/JP2006/303250
§ 371 (c)(1),
(2), (4) Date: Aug. 22, 2007

(87) PCT Pub. No.: WO2006/090769
PCT Pub. Date: Aug. 31, 2006

(65) Prior Publication Data
US 2009/0121704 A1    May 14, 2009

(30) Foreign Application Priority Data
Feb. 23, 2005 (JP) .............................. 2005-047306

(51) Int. Cl.
*G01R 15/18* (2006.01)
*G01R 33/02* (2006.01)

(52) U.S. Cl. .............................. 324/117 R; 324/117 H; 324/127

(58) Field of Classification Search ... 324/117 R–117 H
See application file for complete search history.

(56) References Cited

U.S. PATENT DOCUMENTS

| | | | | |
|---|---|---|---|---|
| 5,041,780 A | * | 8/1991 | Rippel | ..................... 324/117 H |
| 6,310,470 B1 | | 10/2001 | Hebing | |
| 6,459,255 B1 | * | 10/2002 | Tamai et al. | ............ 324/117 H |
| 6,472,878 B1 | * | 10/2002 | Bruchmann | ................. 324/424 |
| 6,512,359 B1 | | 1/2003 | Tamal et al. | |
| 6,642,705 B2 | * | 11/2003 | Kawase | .................. 324/117 R |
| 6,876,189 B2 | * | 4/2005 | Takatsuka et al. | ........ 324/117 H |
| 2006/0071655 A1 | * | 4/2006 | Shoji | ...................... 324/117 H |

FOREIGN PATENT DOCUMENTS

| | | |
|---|---|---|
| JP | 59-075158 | 4/1984 |
| JP | 06-201732 | 7/1994 |
| JP | 11-121067 | 4/1999 |
| JP | 2001-066327 | 3/2001 |
| JP | 2001-074783 | 3/2001 |
| JP | 2001-153985 | 6/2001 |
| JP | 2002-156390 | 5/2002 |
| JP | 2002-243766 | 8/2002 |
| WO | WO 94/27157 | 11/1994 |

OTHER PUBLICATIONS

English Translation of International Preliminary Report on Patentability dated Feb. 23, 2006.

* cited by examiner

*Primary Examiner*—Ha Tran T Nguyen
*Assistant Examiner*—Emily Y Chan
(74) *Attorney, Agent, or Firm*—Finnegan, Henderson, Farabow, Garrett & Dunner, L.L.P.

(57) ABSTRACT

The present invention provides a current measuring apparatus having an improved structure to inhibit the possible adverse effect of a current in a different phase and the possible generation of an induced electromotive force caused by a measurement target current, enabling the measurement target current to be accurately detected even with the small size of the apparatus.

6 Claims, 12 Drawing Sheets

CURRENT MEASURING APPARATUS

TECHNICAL FIELD

The present invention relates to a current measuring apparatus, and in particular, to a current measuring apparatus that accurately measures a multiphase current even with the small size of the apparatus.

BACKGROUND ART

To measure a multiphase current flowing through an inverter or the like, it is difficult to accurately measure a current in each phase using a small apparatus that uses a magnetic sensor. A technique of combining a measurement target conductor, a magnetic core, and a magnetic sensor together has often been used to accurately measure the current in each phase without suffering any adverse effect of a magnetic field generated by a current in different phase. A technique has often been used which involves placing a printed circuit board with a signal processing integrated circuit and a magnetic sensor installed thereon in a gap in the core. In this case, the magnetic core is integrated with a printed circuit board. This disadvantageously prevents a reduction in the size of the apparatus. Further, if the circuit board with the magnetic sensor installed thereon is placed in the gap or near the measurement target conductor, an induced electromotive force is exerted in a wiring loop formed by a signal wire between the magnetic sensor and the signal processing circuit. The voltage level of the induced electromotive force can be easily increased above that of an output from the magnetic sensor. As means for correcting this, the signal processing circuit has been improved or corrections have been made by, for example, winding a coil around a core. However, these techniques complicate the circuit or the configuration, making the size reduction difficult.

JP2002-243766A and JP2001-153895A describe a current sensor that detects a magnetic field generated by a current flowing through a measurement target to determine a current value. Further, JP-6-201732A describes a current sensor having a magnetic sensor and a signal processing circuit both mounted on the same circuit board, which is inserted into a gap in a magnetic core.

With the current sensor described in JP2002-243766A and JP2001-153895A, when a measurement target current flows at a frequency of several 100 Hz or higher, in addition to a signal generated by the magnetic sensor, an induced electromotive force caused by the measurement target current is exerted in the wiring between the magnetic sensor and a detection circuit or in the wiring loop in the detection circuit. This disadvantageously prevents accurate measurements. Furthermore, when a multiphase current is to be detected, a magnetic field from a nearby current wire is not uniform and can thus not appropriately be eliminated.

According to JP6-201732A, when the frequency band of the current to be measured increases, it is necessary to minimize the wiring loop area between the magnetic sensors and the signal processing circuit while keeping the distance between the magnetic sensors and the signal processing circuit at a certain value or greater in order to reduce the adverse effect of the induced electromotive force.

An object of the present invention is to provide a current measuring apparatus having an improved structure to inhibit the possible adverse effect of a current in a different phase and the possible generation of an induced electromotive force caused by a measurement target current, enabling the measurement target current to be accurately detected even with the small size of the apparatus.

DISCLOSURE OF THE INVENTION

The present invention provides a current measuring apparatus having a plurality of planar conductors each located parallel to a direction in which a current flows, the plurality of planar conductors being positioned within a single plane, the apparatus measuring a current flowing through at least one of the plurality of conductors, the current flowing through each of the plurality of conductors, characterized by comprising:

a pair of magnetic sensors that senses a magnetic field generated by a current flowing through the measurement target conductor, the magnetic sensors being located symmetrically with respect to the plane and having a magnetic sensing direction of the magnetic sensors located so as to sense a magnetic field generated by a current flowing through the measurement target conductor. This configuration makes it possible to inhibit the possible adverse effect of a current in a different phase and the possible generation of an induced electromotive force caused by a measurement target current, enabling the measurement target current to be accurately detected even with the small size of the apparatus.

The magnetic sensors may be located at positions displaced from a center line of the corresponding planar conductor in a width direction. This arrangement makes it possible to inhibit the possible adverse effect of a current in a different phase and the possible generation of an induced electromotive force caused by a measurement target current, enabling the measurement target current to be accurately detected even with the small size of the apparatus.

The pair of magnetic sensors may be fixed to a circuit board located perpendicularly to the direction of the current, and the circuit board may have a recessed portion or a slot portion into which the conductor is inserted for fixation. The slot portion is located so that an inner surface of the slot portion abuts against a surface of a bus bar. This enables the circuit board to be reliably positioned with respect to the bus bar.

The circuit board may have a conversion section that processes and converts sensing outputs from the magnetic sensors into a value for a current flowing through the conductor and a wiring section electrically connecting the magnetic sensors to the conversion section.

The wiring section may be formed parallel to a direction of the magnetic field. This makes it unlikely that an induced electromotive force is generated by an alternating current flowing through the conductor.

The apparatus may further comprise electromagnetic shield means provided on the conductor different from the measurement target conductor. Application of a magnetic shield such as winding of a magnetic substance or the like enables a further reduction in the adverse effect of a current flowing through the different conductor.

The magnetic sensing direction of each of the magnetic sensors may be inclined through an angle such that the magnetic sensor is located level to the plane and is insensitive to a magnetic field generated by a current flowing through an adjacent conductor. For example, the magnetic sensor is slightly inclined so as to be insensitive to the direction of the synthetic magnetic field by locating a magnetic sensing surface having the magnetic sensing direction corresponding to a normal direction, parallel to a direction of a synthetic magnetic field generated by a current flowing through the different conductor other than measurement target conductor. This enables a further reduction in the adverse effect of a current flowing through the different conductor.

The magnetic sensor may include a Hall element. The Hall element enables the detection of the magnitude of a magnetic field including the direction of the magnetic field. This enables a reduction in the adverse effect of a disturbing magnetic field, allowing the measurement target current to be accurately measured.

BEST MODE FOR CARRYING OUT THE INVENTION

Embodiments of the present invention will be described with reference to the drawings. In figures referenced in the following description, equivalent components are denoted by the same reference numerals throughout the figures. The following description uses Hall elements as magnetic sensors. However, each Hall element can be replaced with any magnetic sensor that detects the direction of a magnetic field and the like to provide an output. For example, a coil or the like may also be utilized as a magnetic sensor.

(Principle)

Figure 1A:
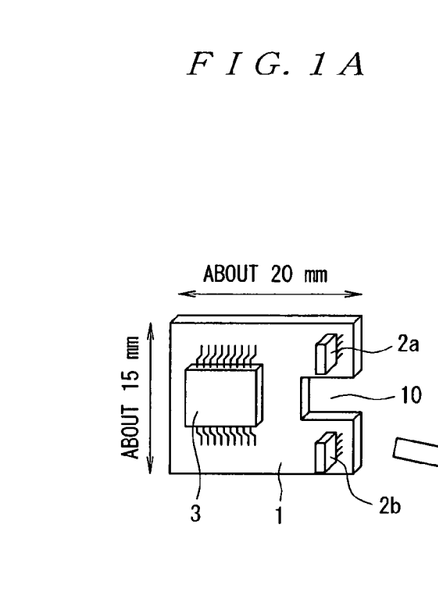
FIG. 1 is a diagram showing the principle of measurement performed by a current measuring apparatus in accordance with the present invention.

As shown in FIG. 1A, the present apparatus includes Hall elements $2a$ and $2b$ that sense a magnetic field generated by a current flowing through a current measurement target and a signal processing integrated circuit 3 that processes sensing outputs from the Hall elements $2a$ and $2b$ to calculate a value for the current flowing through the current measurement target, which are mounted on a printed circuit board 1. In the present example, the printed circuit board 1 has long sides of about 20 mm and short sides of about 15 mm. Further, the printed circuit board 1 has a recessed portion 10 into which a measurement target is inserted. The Hall elements $2a$ and $2b$ are provided near the recessed portion 10. Magnetic sensing surfaces of the Hall elements $2a$ and $2b$ are parallel to the short sides (perpendicular to the long sides). The magnetic sensing surfaces are element surfaces of the Hall elements which are sensitive to an input magnetic field. A normal direction perpendicular to the magnetic sensing surfaces corresponds to a magnetic sensing direction. Unless otherwise specified, the term "magnetic sensing surface" is defined as described above.

Figure 1B:
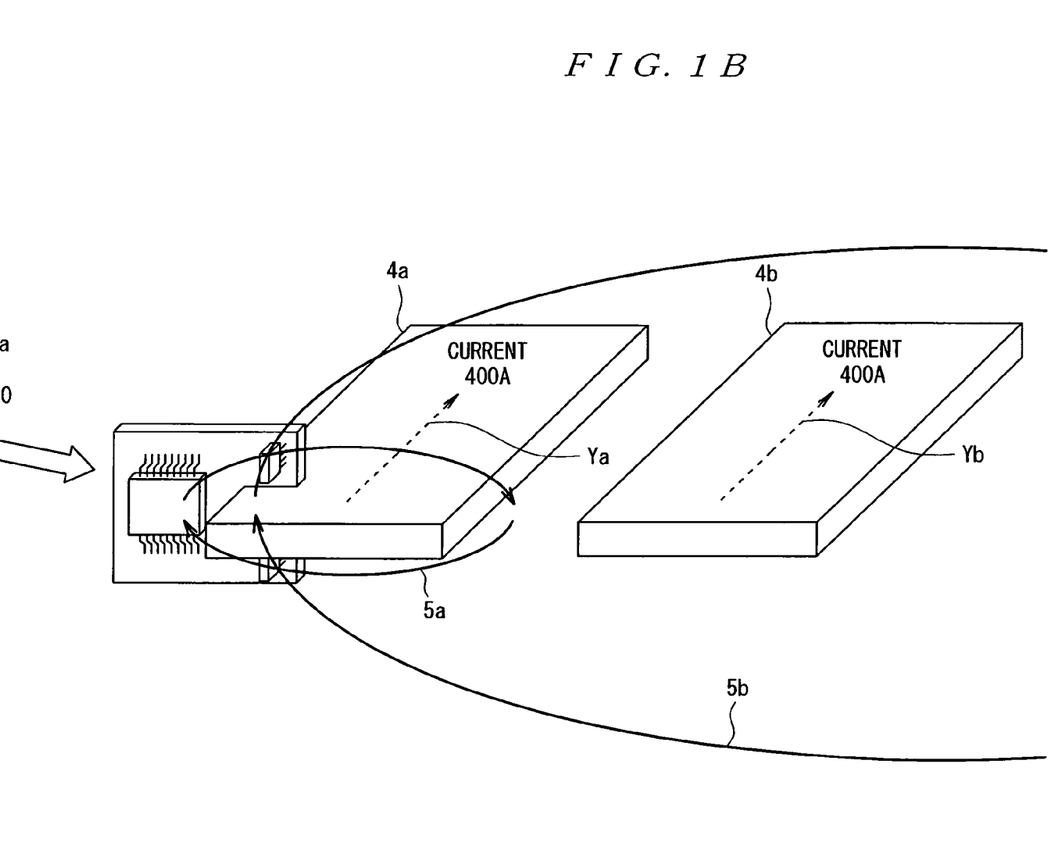

In the present example, a bus bar that is a flat conductor is a current measurement target. For example, as shown in FIG. 1B, one of a plurality of substantially parallel bus bars $4a$, $4b$ is the current measurement target. As shown in the figure, the bus bar $4a$, the current measurement target, is inserted in the recessed portion 10 in the printed circuit board 1. In this case, an inner surface of the recessed portion 10 is fixed so as to abut against a surface of the bud bar $4a$. In this state, the two magnetic sensors $2a$ and $2b$ are fixed across the bus bar $4a$, the measurement target.

In the figure, the two bus bars are juxtaposed. However, three or more bus bars may be juxtaposed.

This positional relationship allows a magnetic field $5a$ generated by a current flowing through the measurement target bus bar $4a$ (arrow Ya in the figure) to enter the magnetic sensing surface of the Hall element almost perpendicularly thereto to output a Hall voltage. On the other hand, a magnetic field $5b$ generated by a current flowing through the other adjacent bus bar $4b$ (arrow Yb in the figure) is substantially parallel to the magnetic sensing surface, minimizing the resulting Hall voltage.

With such a positional relationship as shown in FIG. 1B, a wiring loop surface present on the surface of the printed circuit board 1 is parallel to magnetic fields generated by currents flowing through the bus bars $4a$ and $4b$. This makes it unlikely that an induced electromotive force is generated when alternating currents flow through the bus bars. This will be described below with reference to FIG. 2.

Figure 2:
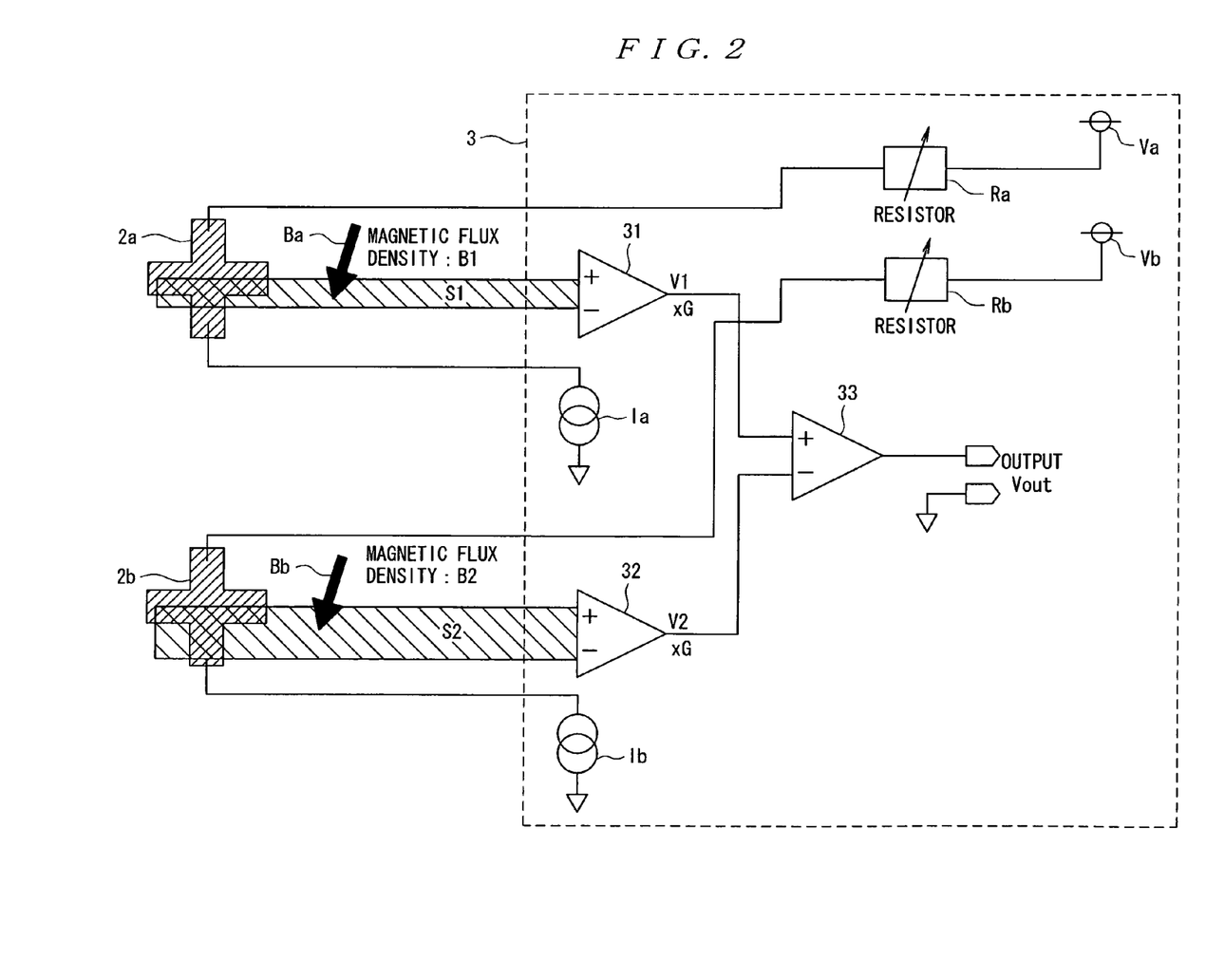
FIG. 2 is a diagram showing wiring for Hall elements and the like mounted on a printed circuit board.

FIG. 2 is a diagram showing wiring for the Hall elements and the like mounted on the printed circuit board. In FIG. 2, the signal processing integrate circuit 3 includes amplifiers 31 and 32, an adder-subtractor 33, current sources Ia and Ib, and resistors Ra and Rb. The Hall element $2a$ is connected in series between a power supply voltage Va and the current source Ia together with the resistor Ra. The Hall element $2b$ is connected in series between a power supply voltage Vb and the current source Ib together with the resistor Rb.

When the magnetic sensing surface of the Hall element $2a$ detects a magnetic field, the Hall element $2a$ outputs a voltage of a value corresponding to the magnetic flux density of the magnetic field. The output is amplified by an amplifier 31, which inputs an amplification output to a positive input terminal of the adder-subtractor 33. Similarly, when the magnetic sensing surface of the Hall element $2b$ detects a magnetic field, the Hall element $2b$ outputs a voltage of a value corresponding to the magnetic flux density of the magnetic field. The output is amplified by an amplifier 32, which inputs an amplification output to a negative input terminal of the adder-subtractor 33. The adder-subtractor 33 derives an output voltage Vout that is the difference between an output voltage value from the Hall element 2a and an output voltage value from the Hall element b.

In this configuration, a wiring loop s1 (loop area is defined as S1) is present between the Hall element 2a and the amplifier 31. A wiring loop s2 (loop area is defined as S2) is present between the Hall element 2b and the amplifier 32. The presence of the wiring loops results in an error in an output voltage Vout from the adder-subtractor 33. That is, when the loop area of the wiring loop is defined as S and the magnetic flux density of the wiring loop is defined as B, an induced electromotive force Vind induced in the wiring loop by a magnetic field is given by:

$$V\text{ind} = -d\phi/dt = -d(B \cdot S)/dt.$$

Thus, with the wiring loop s1 between the Hall element 2a and the amplifier 31, a magnetic field with a magnetic flux density B1 generates:

$$V\text{ind1} = -d(B1 \cdot S1)/dt.$$

Then, Vind1 plus an original Hall voltage Vh1, Vh1+Vind1, is input to the amplifier 31. The amplifier 31 multiplies by a gain G to output G·(Vh1+Vind1).

Similarly, with the wiring loop s2 between the Hall element 2b and the amplifier 32, a magnetic field with a magnetic flux density B2 generates:

$$V\text{ind2} = -d(B2 \cdot S2)/dt.$$

Then, Vind2 plus an original Hall voltage Vh2, Vh2+Vind2, is input to the amplifier 32. The amplifier 32 multiplies by a gain G to output G·(Vh2+Vind2).

An output voltage Vout from the adder-subtractor 33 is equal to the difference between an output from the amplifier 31 and an output from the amplifier 32. That is, the following equation is given.

$$\begin{aligned} Vout &= G \cdot (Vh1 + Vind1 - (Vh2 + Vind2)) \\ &= G \cdot (Vh1 - Vh2) + G \cdot (Vind1 - Vind2) \end{aligned} \quad (1)$$

Here, the difference of areas between the loops s1 and s2 and the difference between the magnetic flux densities B1 and B2 result in the difference between Vind1 and Vind2. Thus, the second term of Equation (1), as an error, is added to the first term of Equation (1) which is the original output from the Hall element. The magnetic sensing surfaces of the Hall elements 2a and 2b are arranged parallel to each other. This cancels the adverse effect of a uniform magnetic field on the Hall voltages Vh1 and Vh2.

Referring back to FIG. 1B, with the positional relationship shown in FIG. 1B, the wiring loop surface present on the surface of the printed circuit board 1, located adjacent to the magnetic sensing surfaces of the Hall elements, is parallel to magnetic fields generated by currents flowing through the bus bars 4a and 4b. This makes it unlikely that an induced electromotive force (that is, the second term of Equation (1)) is generated by an alternating current flowing through the bus bar. That is, the configuration in FIG. 1B allows the current flowing through the bus bar 4a to be sensitively measured while sharply reducing the adverse effect of an induced electromotive force generated by a currents flowing through the adjacent bus bar 4b and the measurement target bus bar 4a.

The currents flowing through the bus bars 4a and 4b are at, for example, 400 A. Changes in the frequencies of the flowing currents change the distributions of the current densities in the bus bars 4a and 4b. Thus, although a current sensor located in a central portion of the bus bar significantly changes the current sensitivity of the current sensor, the configuration in FIG. 1B allows the current sensor to be located near an edge of the bus bar where the above adverse effect is reduced.

(Adverse Effect of an Adjacent Bus Bar Current)

Figure 3A:
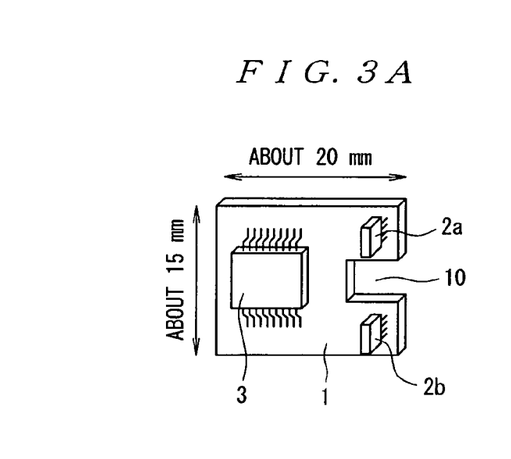
FIG. 3 is a diagram showing calculation conditions for the calculation of the adverse effect of an adjacent bus bar current which may be exerted when a current is measured using the Hall elements.

The inventors calculated the adverse effect of a current flowing through the adjacent bus bar when currents in three phases were passed through the respective three bus bars and when the currents were measured using Hall elements. FIG. 3 shows calculation conditions in this case. That is, as shown in FIG. 3A, the print circuit board 1 has long sides of about 20 mm and short sides of about 15 mm. The printed circuit board 1 has a recessed portion 10 into which a measurement target is inserted.

Figure 3B:
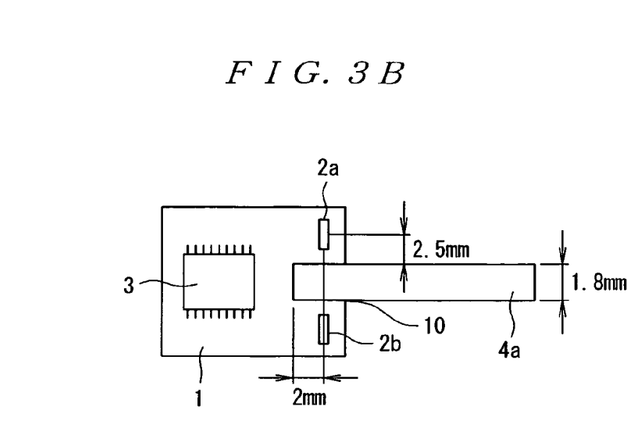

Further, FIG. 3B shows that the bus bar 4a is placed in the recessed portion of the printed circuit board 1a. The recessed portion 10 has a width of 1.8 mm, and the bus bar 4a is fixedly inserted into the recessed portion 10. The Hall elements 2a, 2b are each provided at a position 2.5 mm, in a short side direction, from the position of an inner surface of the recessed portion 10 which abuts against a major surface of the bus bar 4a and 2 mm, in a long side direction, from the position of an inner surface of the recessed portion 10 which abuts against a side surface of the bus bar 4a. The magnetic sensing surface of each of the Hall elements 2a and 2b extends parallel to the short sides of the printed circuit board 1 (perpendicular to the long sides).

Figure 3C:
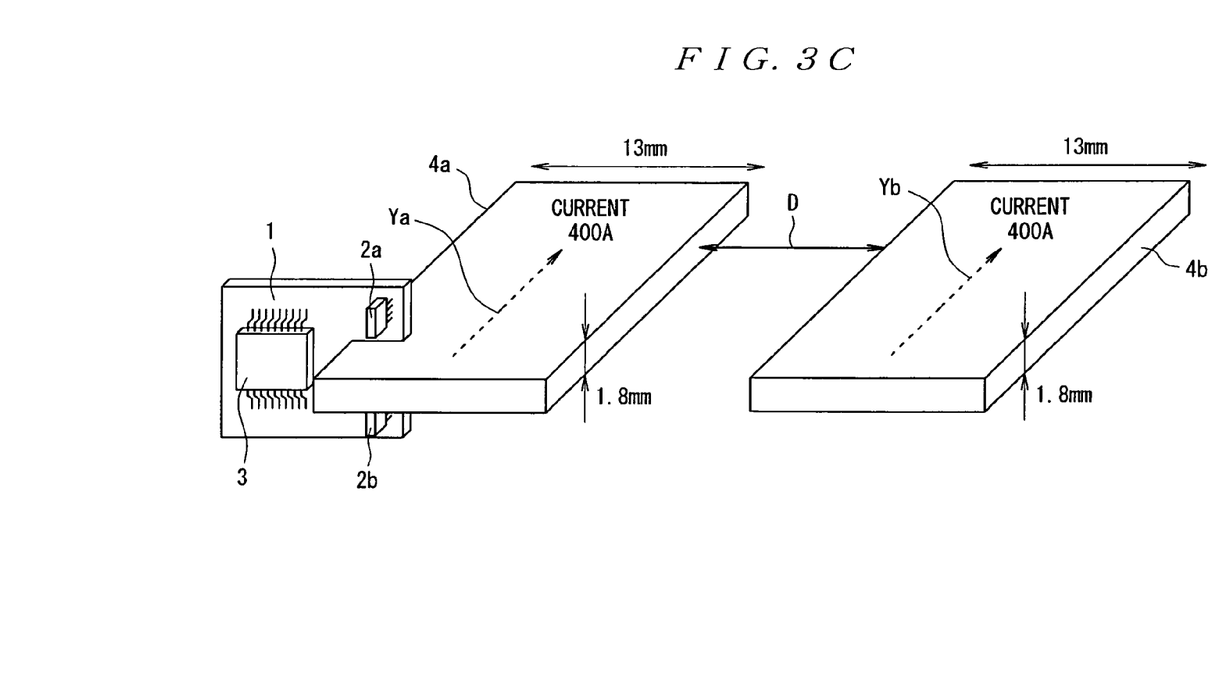

FIG. 3C shows a positional relationship with the adjacent bus bar. That is, the bus bars 4a and 4b are provided adjacent to each other and the inter-end distance between the bus bars is defined as D. The bus bar 4a is the current measurement target. Calculation was made of the adverse effect of a magnetic field generated by a current flowing through the bus bar 4b on the measurement of a current flowing through the bus bar 4a.

Figure 4A:
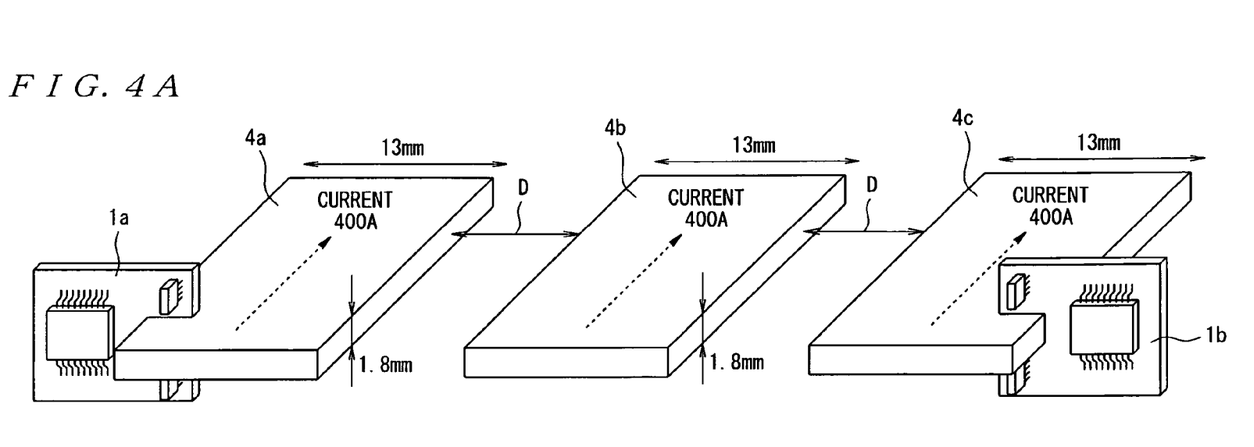
FIG. 4 is a diagram showing the results of the calculation of the adverse effect of the adjacent bus bar current which may be exerted when a current is measured using the Hall elements.
Figure 4B:
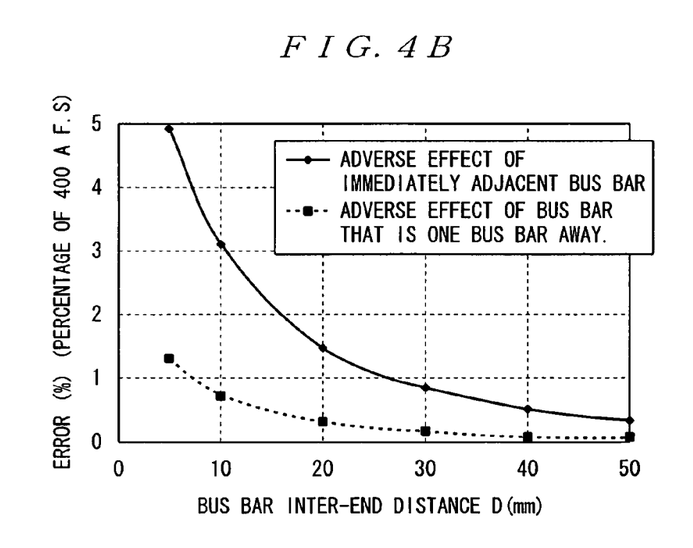
Figure 4C:
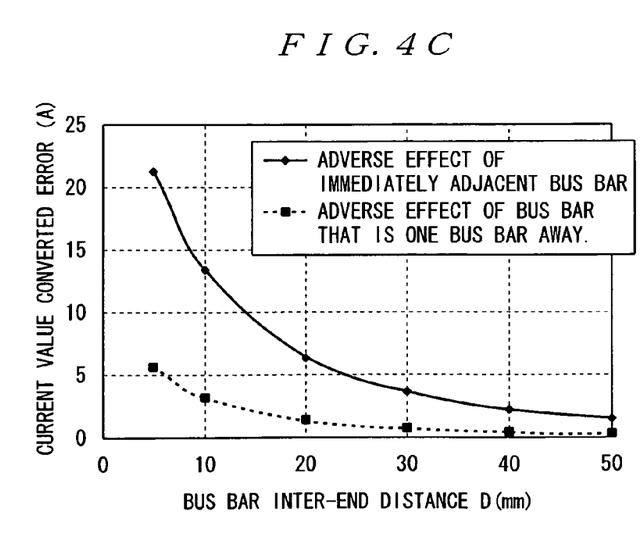

As a result, the results shown in FIG. 4 were obtained. Printed circuit boards 1a and 1b each having a combination of two Hall elements and a signal processing integrated circuit were arranged in association with three bus bars 4a to 4c arranged as shown in FIG. 4A and through which currents in three phases flow. A current of 400 A was passed through each of the bus bars 4a to 4c. At this time, the level of the adverse effect of a current flowing through each bus bar was examined. Graphs denoted by ♦ in FIGS. 4B and 4C show the adverse effect (hereinafter referred to as the adverse effect (1)) of a magnetic field generated by a current flowing through the central bus bar 4b on the current sensor located at the outer bus bar 4a. Graphs denoted by ■ in FIGS. 4B and 4C show the adverse effect (hereinafter referred to as the adverse effect (2)) of a magnetic field generated by a current flowing through the outer bus bar 4c on the current sensor located at the different outer bus bar 4a. FIG. 4B shows the adverse effect (% error) of the adjacent bus bar current on the current sensors located at the bus bars at the opposite ends. FIG. 4C shows the adverse effect (current value converted error) of the adjacent bus bar current on the current sensors located at the bus bars at the opposite ends.

With reference to FIGS. 4B and 4C, the axis of abscissa indicates the bus bar inter-end distance D. An inter-end distance of at least about 26 to 27 mm enables the adverse effect (1) to be set to at most 4 A, allowing the adverse effect to be reduced to at most 1%. An inter-end distance of at least 7 to 8 mm enables the adverse effect (2) to be set to at most 4 A, allowing the adverse effect to be reduced to at most 1%.

EMBODIMENT 1

Figure 5A:
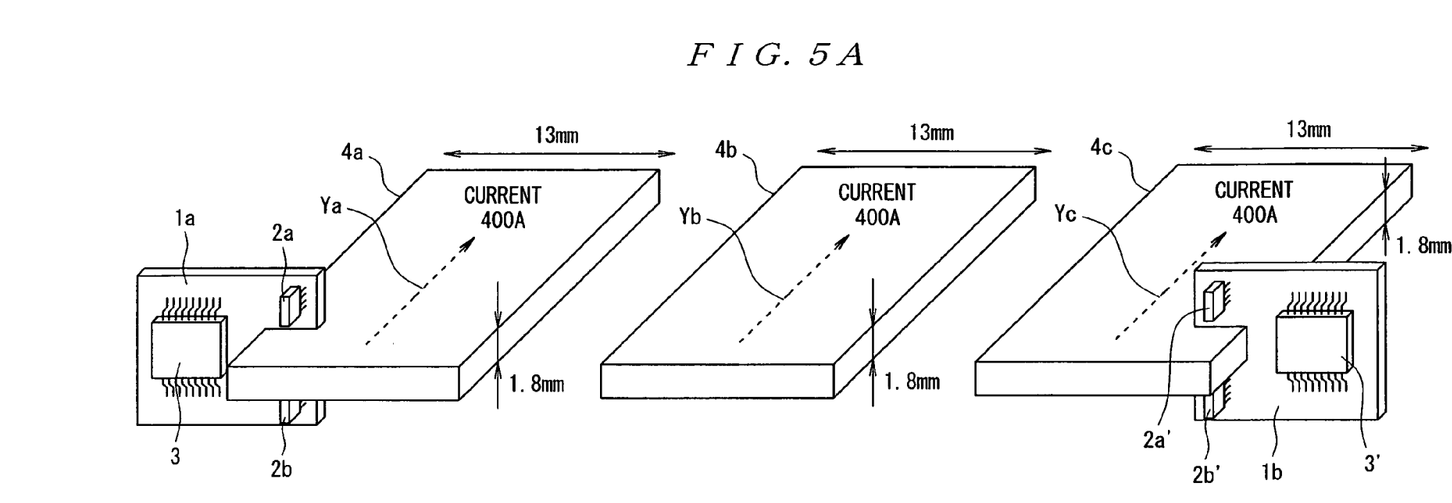
FIG. 5 is a diagram showing the configuration of Embodiment 1 of the current measuring apparatus in accordance with the present invention.

FIG. 5 shows the configuration of Embodiment 1 of the current measuring apparatus in accordance with the present invention. In FIG. 5A, the three bus bars 4a, 4b, 4c are provided adjacent and substantially parallel to one another. Of the three bus bars 4a, 4b, 4c, the bus bar 4a, located at the end, is inserted in the recessed portion of the printed circuit board 1a. The printed circuit board 1a has the Hall elements 2a and 2b and the signal processing integrated circuit 3 as in the case of FIG. 1. Similarly, the bus bar 4c, located at the opposite end, is placed in the recessed portion of the printed circuit board 1b.

Figure 5B:
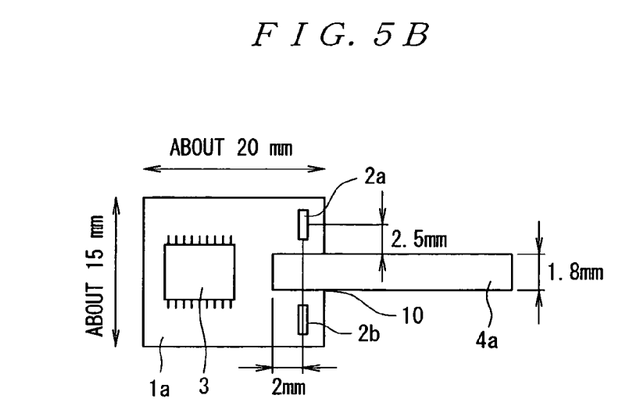

Here, FIG. 5B shows that the bus bar 4a is inserted in the recessed portion of the printed circuit board 1a. As shown in FIG. 5B, the printed circuit board 1a has long sides of about 20 mm and short sides of about 15 mm. Each of the bus bars 4a to 4c has a width of 13 mm and a thickness of 1.8 mm. Further, the printed circuit board 1a has the recessed portion 10 into which the measurement target bus bar is inserted. The recessed portion 10 has a width of 1.8 mm and the bus bar 4a is fixedly inserted into the recessed portion 10. The Hall elements 2a, 2b are each provided at a position 2.5 mm, in the short side direction, from the position of the inner surface of the recessed portion 10 which abuts against the major surface of the bus bar 4a and 2 mm, in the long side direction, from the position of the inner surface on the recessed portion 10 which abuts against a side surface of the bus bar 4a. The magnetic sensing surface of each of the Hall elements 2a and 2b extends parallel to the short sides of the printed circuit board 1a (perpendicular to the long sides). The printed circuit board 1b, where the bus bar 4c located at the opposite end is inserted in the recessed portion, also has a similar configuration and has the Hall elements 2a', 2b' and a signal processing integrated circuit 3' mounted thereon.

With this configuration, it is assumed that currents in three phases from an inverter or the like flow through the three bus bars 4a, 4b, 4c. The currents in three phases from the inverter or the like always have a sum of 0 so that measuring the currents in two phases allows the current in the third phase to be calculated. The current sensors may have any of the arrangements but are preferably arranged at the opposite ends as shown in FIG. 5A to allow the adverse effect in each phase to be minimized. Furthermore, if the distance between the bus bars is, for example, 10 mm, it is difficult to provide the printed circuit board 1a or 1b in connection with spaces.

Thus, as shown in FIG. 5A, the printed circuit boards 1a and 1b with the current sensors mounted thereon are arranged, from the outside, at two of the three-phase bus bars 4a, 4b, 4c disposed parallel to one another which are arranged at the opposite ends. Thus, arranging the printed circuit boards at the opposite ends makes it possible to ensure a distance from the adjacent bus bar, enabling a reduction in the adverse effect of the adjacent bus bar.

EMBODIMENT 2

Figure 6A:
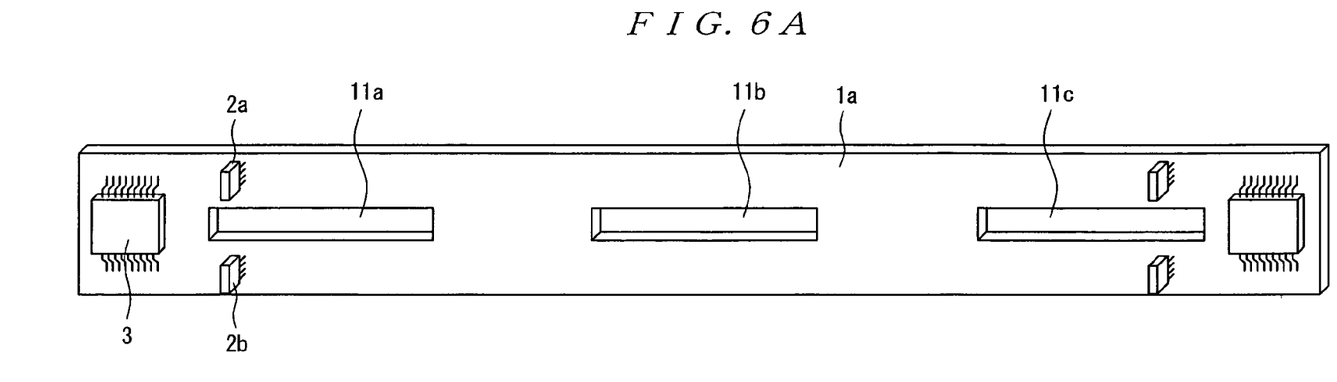
FIG. 6 is a diagram showing the configuration of Embodiment 2 of the current measuring apparatus in accordance with the present invention.
Figure 6B:
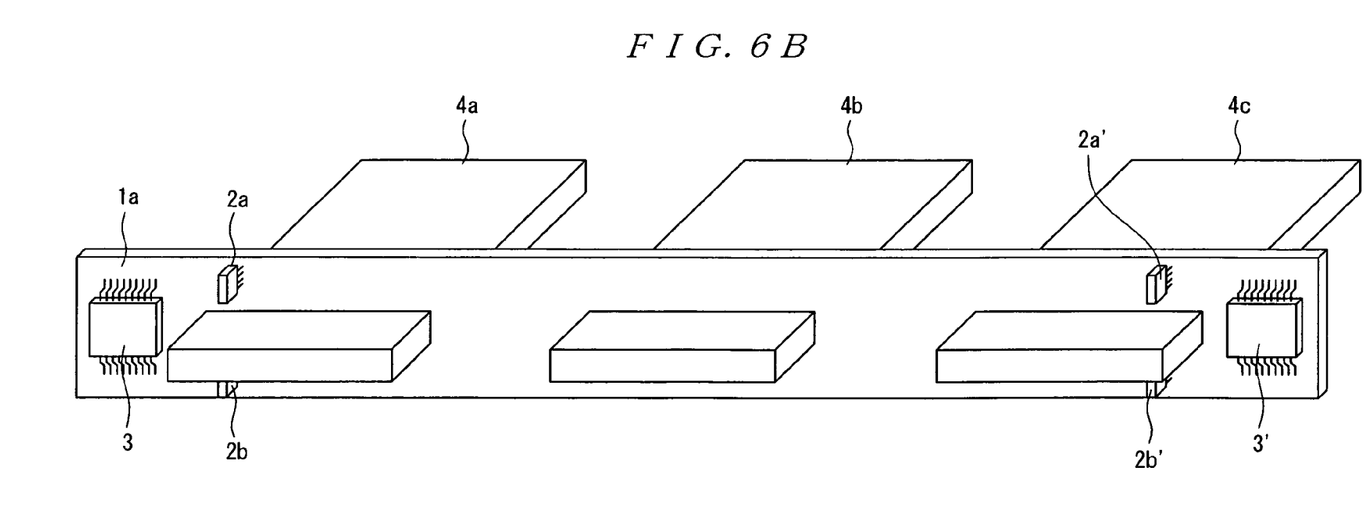

As shown in FIG. 6A, slot portions 11a to 11c may be formed in the single printed circuit board 1a so that the bus bars can be inserted into the slot portions 11a to 11c. In this case, as shown in FIG. 6B, currents can be measured as is the case with FIG. 5 by fixedly inserting the bus bars 4a to 4c into the corresponding slot portions 11a to 11c in the printed circuit board 1a. In the present example, using the single printed circuit board 1a to construct the current measuring apparatus enables the bus bars and the Hall elements 2a and 2b to be easily positioned.

EMBODIMENT 3

Figure 7:
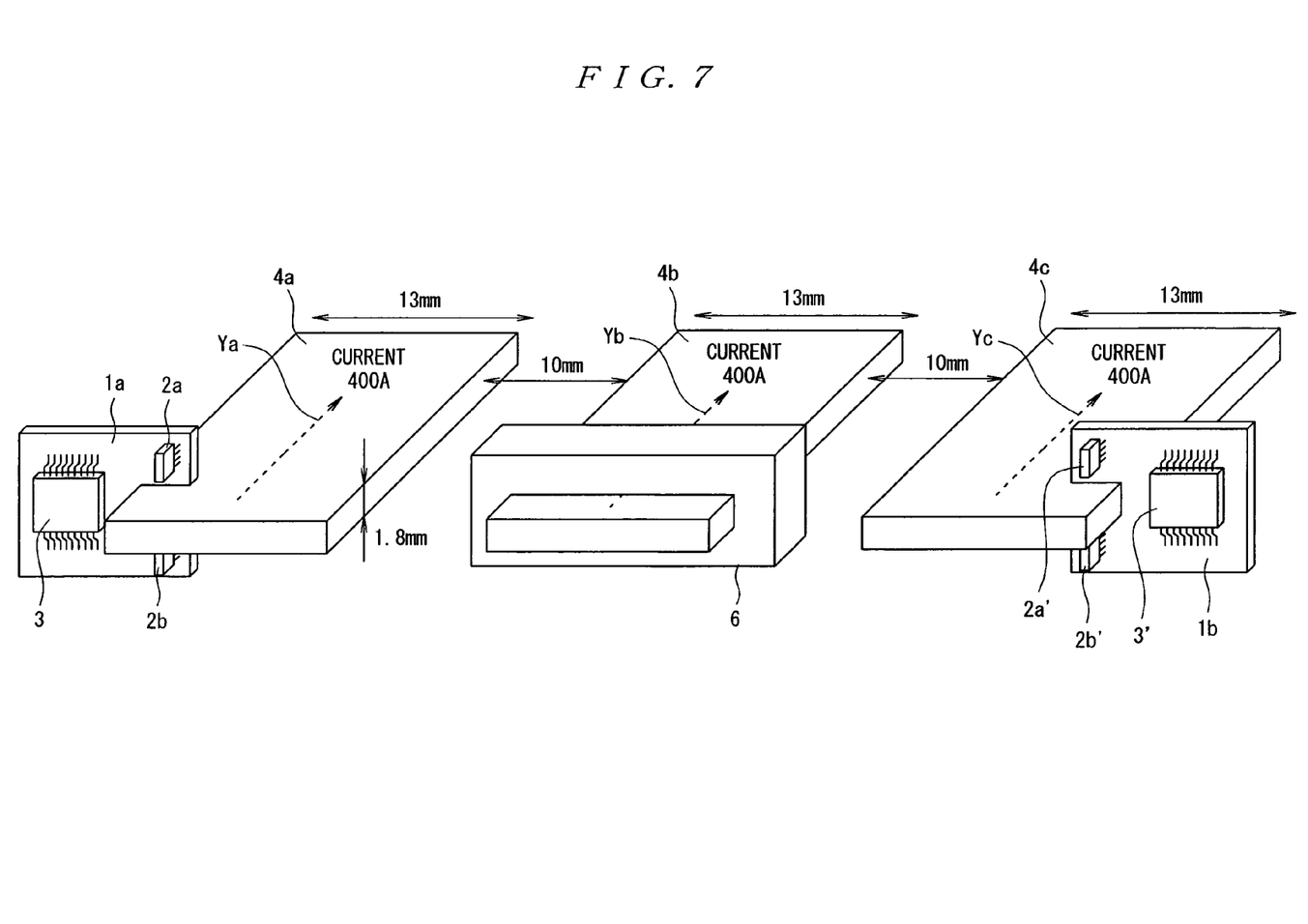
FIG. 7 is a diagram showing the configuration of Embodiment 3 of the current measuring apparatus in accordance with the present invention.

The adverse effect of the central bus bar on the outer bus bars can be reduced by winding a magnetic substance, as a shield, around the immediately adjacent bus bar, which makes the maximum impact. For example, as shown in FIG. 7, the magnetic substance 6 is provided on one of the three bus bars 4a, 4b, 4c, that is, the central bus bar 4b. The present example adopts a configuration in which the bus bar 4b is inserted into the slot portion of the magnetic substance 6. The bus bar 4b is not the measurement target, so that a gap in which the printed circuit board is provided need not be provided in the magnetic substance 6. This enables a size reduction, allowing an increase in the entire size of the apparatus to be inhibited.

Providing the magnetic substance 6 makes it possible to eliminate the adverse effect of the immediately adjacent bus bar, allowing a reduction in the adverse effect on the Hall elements to at most 1%.

EMBODIMENT 4

Figure 8:
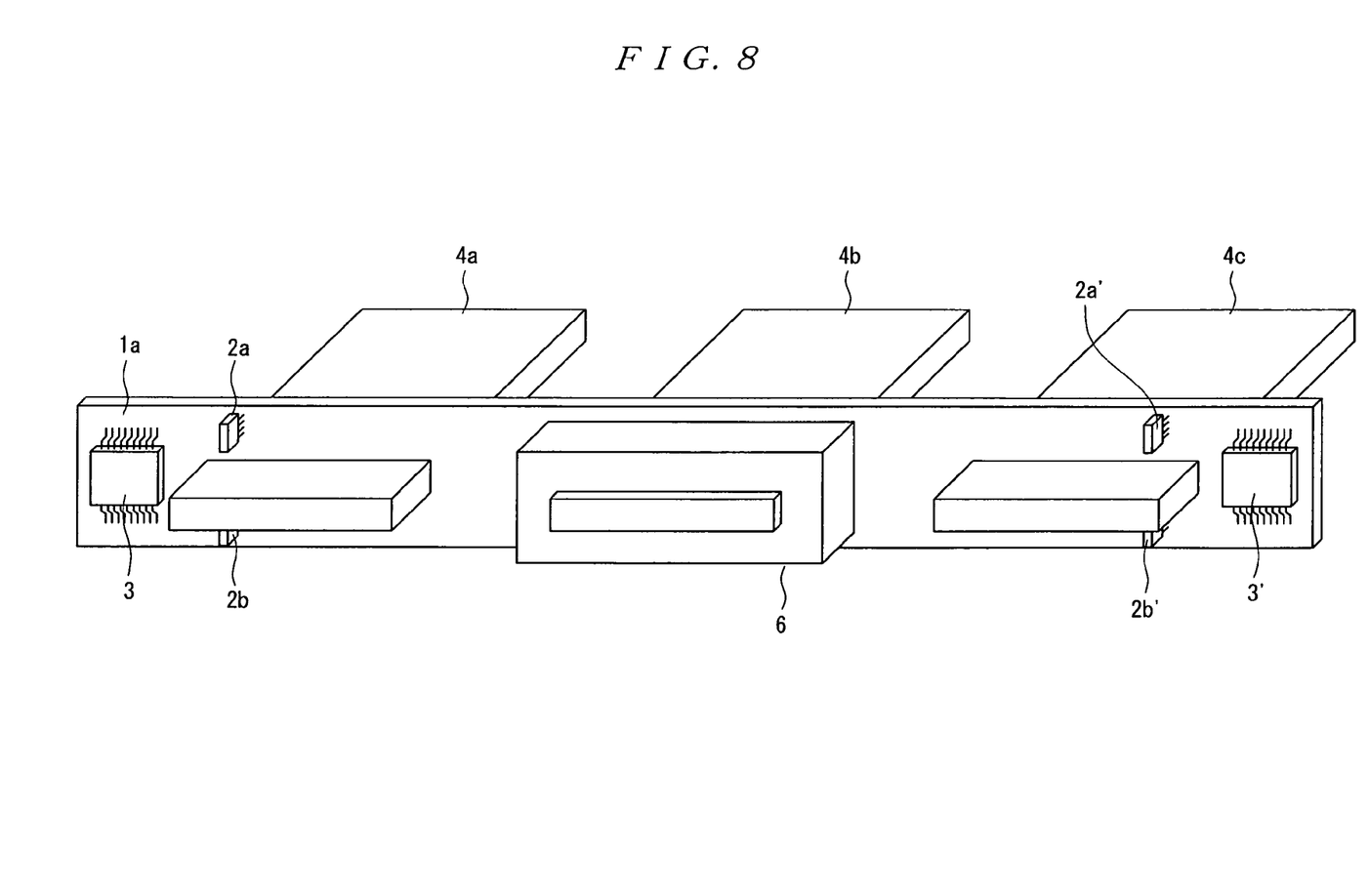
FIG. 8 is a diagram showing the configuration of Embodiment 4 of the current measuring apparatus in accordance with the present invention.

Further, a magnetic substance may be added to the configuration shown in FIG. 6. That is, as shown in FIG. 8, one of the three bus bars 4a, 4b, 4c, that is, the central bus bar 4b, is provided with the magnetic substance 6.

This configuration allows the bus bars and the Hall elements 2a and 2b to be easily positioned owing to the use of the single printed circuit board 1a. This also makes it possible to eliminate the adverse effect of the immediately adjacent bus bar, allowing a reduction in the adverse effect on the Hall elements to at most 1%.

EMBODIMENT 5

Figure 9:
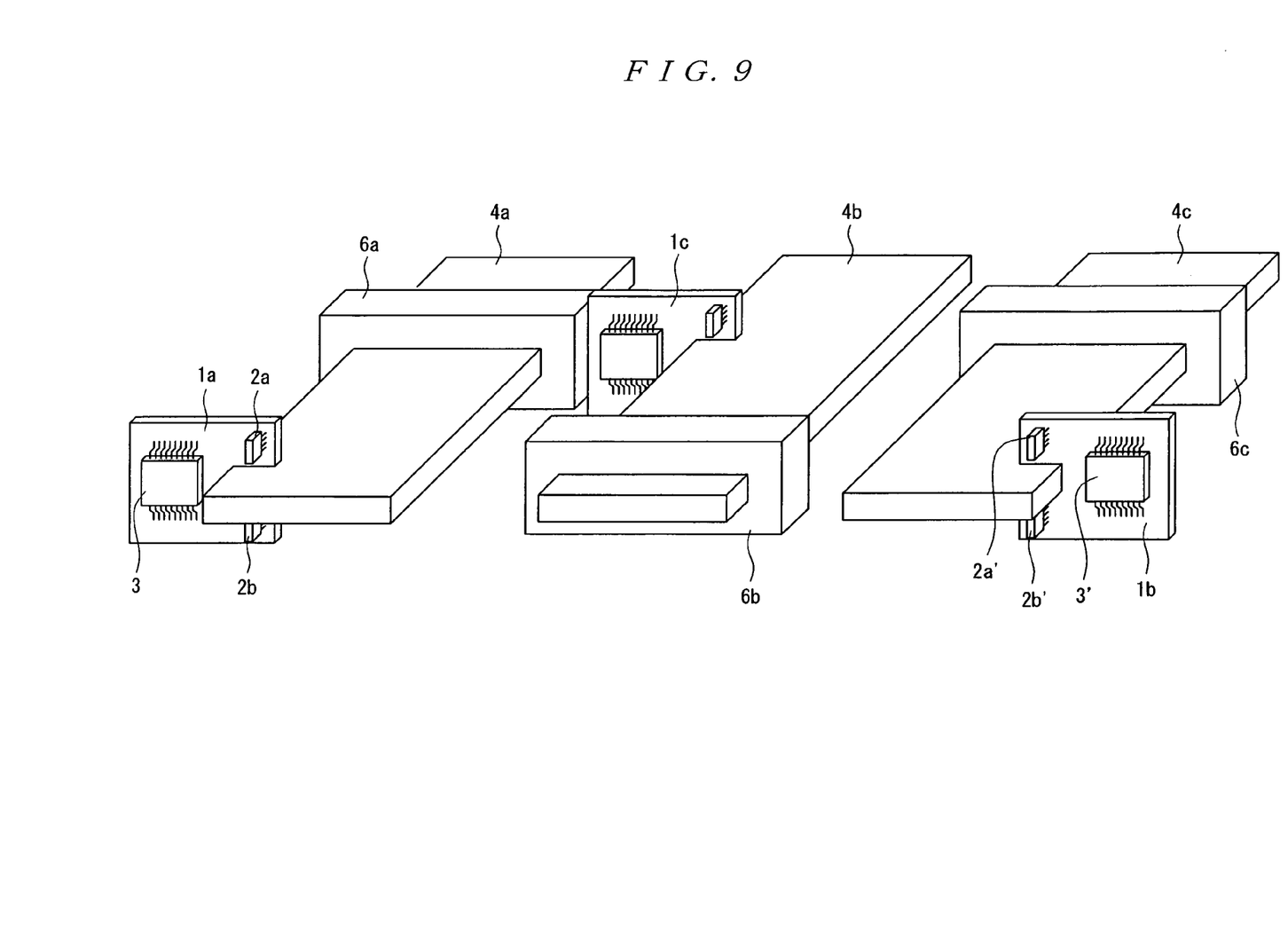
FIG. 9 is a diagram showing the configuration of Embodiment 5 of the current measuring apparatus in accordance with the present invention.

Each of the bus bars may be provided with a magnetic substance. That is, as shown in FIG. 9, the three bus bars 4a, 4b, 4c are provided with magnetic substances 6a, 6b, 6c. In spite of the increased number of magnetic substances, this configuration allows the detection of currents in three phases flowing through the three bus bars 4a, 4b, 4c. However, with the distance between the bus bars reduced (to, for example, about 10 mm), it is difficult to insert the printed circuit board 1c into the central bus bar 4b in connection with the circuit board dimensions.

EMBODIMENT 6

Figure 10A:
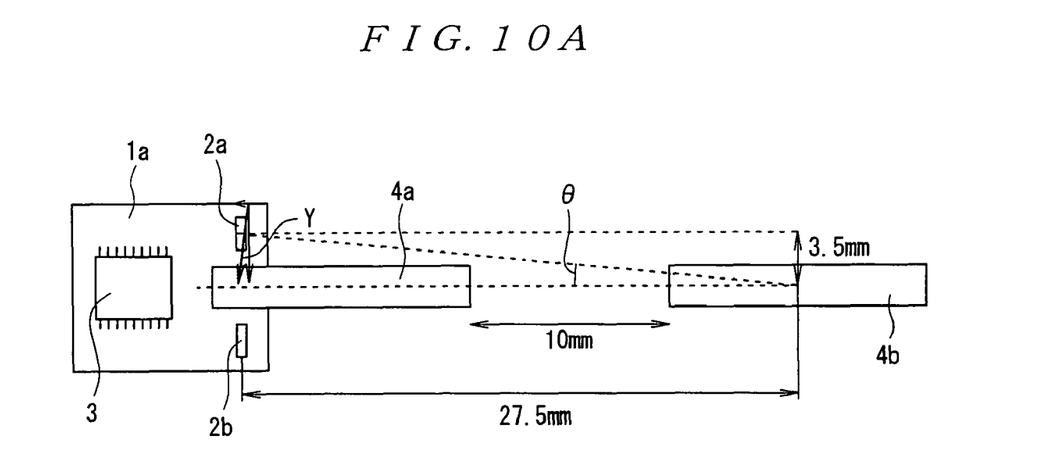
FIG. 10 is a diagram showing the configuration of Embodiment 6 of the current measuring apparatus in accordance with the present invention.

The two Hall elements should originally be arranged parallel to each other to cancel a uniform disturbing magnetic field. However, if the adverse effect caused by a magnetic field generated by a current flowing through the adjacent bus bar is worse than that of disturbing magnetic fields, priority should be given to a reduction in the adverse effect of the magnetic field generated by the current flowing through the adjacent bus bar. To achieve this, the Hall elements may be slightly inclined so that the magnetic sensing surface of each Hall element lies parallel to a direction of a magnetic field generated by the adjacent bus bar. For example, as shown in FIG. 10A, if the distance between the bus bars is 10 mm, the distance between the center of the adjacent bus bar and the center of the Hall element 2a is 27.5 mm, the distance between the center of the thickness of the measurement target bus bar 4a and the center of the Hall element 2a is 3.5 mm, then an angle θ in the figure is about 7°. An arrow Y in the figure denotes the adverse effect component of the adjacent bus bar.

Figure 10B:
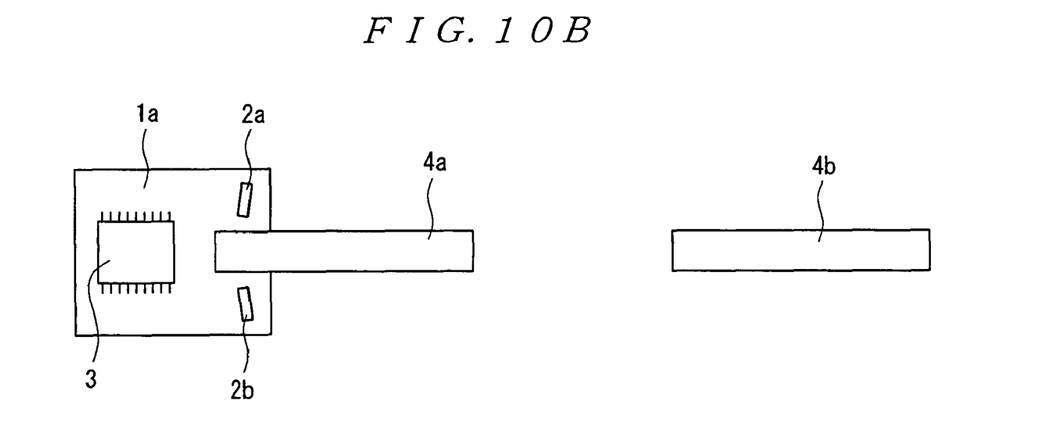

In the present example, as shown in FIG. 10B, the Hall elements 2a and 2b are inclined to place a current-induced magnetic field in the adjacent bus bar substantially parallel to the magnetic sensing surface of the Hall element so that the magnetic sensing surface becomes insensitive to the magnetic field. Thus inclining the Hall element enables accuracy to be significantly improved. Inclining the Hall element through 7° as in the present example reduces the adverse effect on the detection of the measurement target current magnetic field to cos(7deg)=0.993, that is, about 0.7%.

EMBODIMENT 7

Embodiment 6, described above, intends to exert, on the Hall elements 2a and 2b, the synergy of the effect of reducing the adverse effect of increased distance from the adjacent bus bar and the effect of inclining the Hall elements 2a and 2b. According to the present embodiment, the Hall elements 2a and 2b inclined to reduce the adverse effect of the adjacent bus bar current as described in Embodiment 6 are further arranged near a closer end of the adjacent bus bar to efficiently capture a magnetic field generated by the measurement target current (that is, the magnetic field to be measured).

Figure 11:
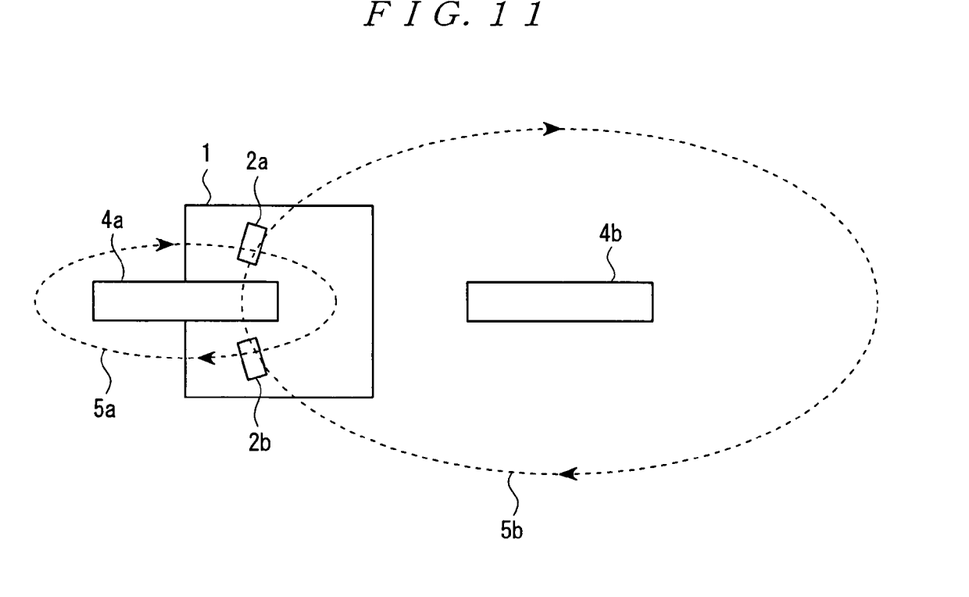
FIG. 11 is a diagram showing the configuration of Embodiment 7 of the current measuring apparatus in accordance with the present invention.

As shown in FIG. 11, a magnetic field 5b generated by a current flowing through the adjacent bus bar 4b enters the inclined Hall elements 2a and 2b almost perpendicularly to the magnetic sensing direction. Thus, the Hall elements 2a and 2b becomes insensitive to the magnetic field. This is the same action as that taken in Embodiment 6.

On the other hand, a magnetic field 5a generated by a current flowing through the measurement target bus bar 4a coincides more with the magnetic sensing direction of the Hall elements 2a and 2b than in Embodiment 6. This enables the more efficient detection of the magnetic field 5a generated by the measurement target current.

Although not shown in FIG. 11, the signal processing integrated circuit 3 is mounted on the printed circuit board 1. A magnetic substance may be provided on any of the bus bars.

EMBODIMENT 8

Figure 12:
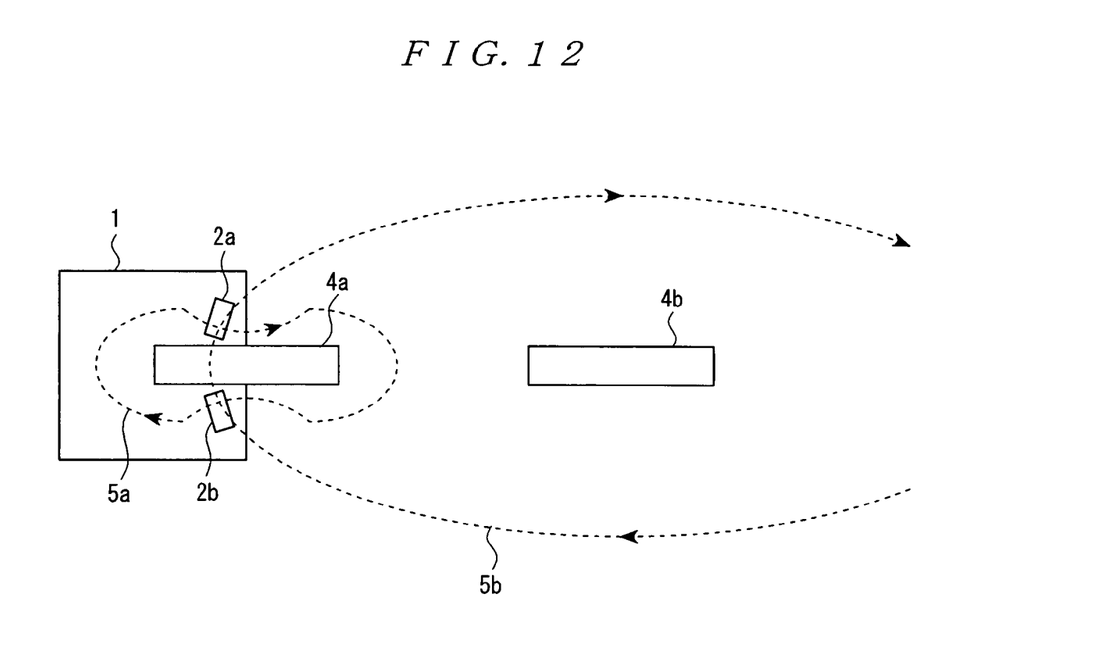
FIG. 12 is a diagram showing the configuration of Embodiment 8 of the current measuring apparatus in accordance with the present invention.

When an alternating (frequency: about several kHz or higher) current flows through the measurement target bus bar, a skin effect causes the resulting magnetic field 5a to exhibit a cocoon-shaped distribution as shown in FIG. 12. According to the present embodiment, the Hall elements 2a and 2b are arranged so as to conform to the distribution. The magnetic field 5b generated by a current flowing through the adjacent bus bar 4b enters the inclined Hall elements 2a and 2b almost perpendicularly to the magnetic sensing direction. Thus, the Hall elements 2a and 2b becomes insensitive to the magnetic field.

In contrast, the magnetic field 5a generated by a current flowing through the measurement target bus bar 4a coincides more with the magnetic sensing direction of the Hall elements 2a and 2b. Thus, if an alternating (frequency: about several kHz or higher) current flows through the measurement target bus bar 4a, the magnetic field 5a generated by the measurement target current can be more efficiently detected than in the case in which Hall elements 2a and 2b are not inclined.

Although not shown in FIG. 12, the signal processing integrated circuit 3 is mounted on the printed circuit board 1. A magnetic substance may be provided on any of the bus bars.

EMBODIMENT 9

Figure 13:
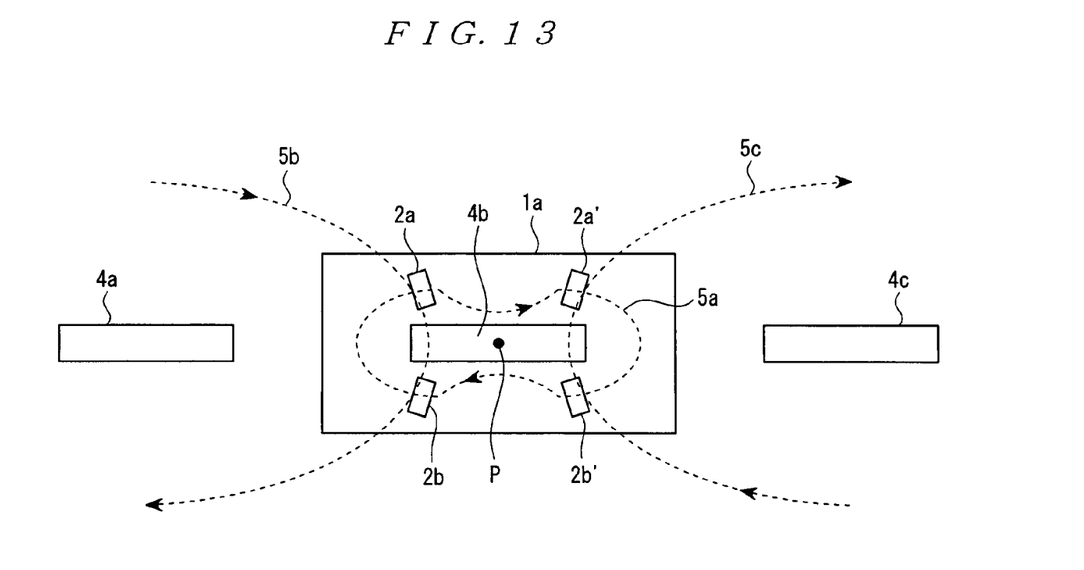
FIG. 13 is a diagram showing the configuration of Embodiment 9 of the current measuring apparatus in accordance with the present invention.

Description will be given of an arrangement suitable for those of at least three bus bars which are arranged at positions other than the opposite ends. With reference to FIG. 13, description will be given below of an arrangement suitable for a central one of three bus bars.

As shown in FIG. 13, according to the present embodiment, two sets of the Hall elements 2a and 2b and Hall elements 2a' and 2b' are arranged point-symmetrically with respect to the center P of the bus bar 4b, through which the measurement target current flows. The bus bar 4b is fixedly inserted into the slot in the printed circuit board 1a.

This arrangement enables a preferential reduction in the adverse effect of a current flowing through the adjacent bus bars 4a, 4c, which lie close to the Hall elements to significantly affect the Hall elements. Moreover, even when a high frequency current flows through the measurement target bus bar 4b, the magnetic field 5a generated by the measurement target current can be more efficiently detected.

FIG. 13 shows that the two sets of the Hall elements are arranged point-symmetrically with respect to the center P of the measurement target bus bar 4b, with a high frequency current flowing through the bus bar 4b. The magnetic field 5a resulting from the skin effect exhibits a cocoon-shaped distribution as in the case with FIG. 12.

Here, the Hall elements 2a and 2b' may be omitted to allow the combination of the Hall elements 2a' and 2b to detect the magnetic field 5a or the Hall elements 2a' and 2b may be omitted to allow the combination of the Hall elements 2a and 2b' to detect the magnetic field 5a.

Although not shown in FIG. 13, the signal processing integrated circuit 3 is mounted on the printed circuit board 1a. A magnetic substance may be provided on any of the bus bars.

(Method for Measuring a Current)

The above current measuring apparatus uses a method for measuring a current as described below. That is, the current measuring apparatus has n (n is an integer of equal to or greater than 2) flat conductors provided parallel to the longitudinal direction and adjacent to one another when a current flows in the longitudinal direction of the n conductors, and each having a generally rectangular cross section which extends perpendicularly to a longitudinal direction and which is thick in a width direction and thin in a thickness direction, the method comprising measuring the magnitudes of currents flowing through m (m is an integer equal to or greater than 1 and equal to or smaller than n) of the n flat conductors, on the basis of outputs from two magnetic sensors provided near each of the m measurement target conductors to sense a magnetic field generated by a current flowing through each of the m measurement target conductors, wherein the two magnetic sensors are provided at a predetermined distance from a widthwise central position of each of the m measurement target conductors in the width direction and symmetrically with respect to each of the m measurement target conductors, and a magnetic sensing direction of each of the magnetic sensors aligns with a direction of the magnetic field.

The method for measuring a current makes it possible to inhibit the possible adverse effect of a current in a different phase and the possible generation of an induced electromotive force caused by the measurement target current, enabling the measurement target current to be accurately detected even with the small size of the apparatus.

The term "longitudinal direction" as used herein means a direction with respect to the conductor in which a current flows, and does not necessarily refer to the direction of the long sides of the conductor shape. This expression is used because the current generally flows in the direction of the long sides.

CONCLUSION

As described above, according to the present invention, the printed circuit board has the recessed portion or the slot portion and is placed so that the inner surface of the recessed portion or the slot portion abuts against the surface of the bus bar. This enables the printed circuit board to be reliably positioned with respect to the bus bar.

Further, the Hall element is mounted on the printed circuit board so that the magnetic sensing surface of the Hall element lies substantially parallel to the direction of a magnetic field generated by a current flowing through the bus bar different from the current measurement target. This allows a magnetic field generated by a current flowing through the adjacent bus bar to be applied in a direction almost parallel to the magnetic sensing surface of the Hall element. The adverse effect of the magnetic field can be sharply reduced. The printed circuit board is placed perpendicularly to the current measurement target bus bar so that the surface of the printed circuit board on which the wiring electrically connecting together the Hall element and the circuit calculating the current value lies substantially parallel to the direction of the magnetic field. This makes it possible to make a magnetic field generated by the measurement target current parallel to a wiring loop surface formed on the printed circuit board. This in turn makes it possible to inhibit the possible generation of an induced electromotive force caused by the measurement target current.

That is, although output accuracy is sharply reduced by the application of the induced electromotive force generated by the wiring loop to a Hall voltage, the above arrangement allows the measurement target current to flow normal to the circuit board surface of the printed circuit board, making it possible to locate the wiring loop surface almost parallel to the direction of the magnetic field. This enables a sharp reduction in the adverse effect of an induced electromotive force caused by an alternation in measurement target current.

The Hall element provided near the recessed portion or the slot portion can be located above the edge (end) of the measurement target flat bus bar. If a current flows through the flat conductor, measurements almost independent from the frequency of the current are taken from the vicinity of the edge. Consequently, this arrangement makes it possible to inhibit a change in current sensitivity caused by a change in the current distribution in the bus bar which depends on the frequency of the measurement target current.

(Additional Statement for Claims)

(1) A current measuring apparatus having n (n is an integer of at least 2) flat conductors provided parallel to the longitudinal direction and adjacent to one another and each having a generally rectangular cross section which extends perpendicularly to a longitudinal direction and which is thick in a width direction and thin in a thickness direction, the apparatus measuring the magnitudes of currents flowing through m (m is an integer of at least 1 and at most n) of the n flat conductors, when a current flows in the longitudinal direction of the n conductors, on the basis of outputs from two magnetic sensors provided near each of the m measurement target conductors to sense a magnetic field generated by a current flowing through each of the m measurement target conductors, characterized in that:

the two magnetic sensors are provided at a predetermined distance from a widthwise central position of each of the m measurement target conductors in the width direction and symmetrically with respect to each of the m measurement target conductors, and a magnetic sensing direction of each of the magnetic sensors aligns with a direction of the magnetic field. This configuration makes it possible to inhibit the possible adverse effect of a current in a different phase and the possible generation of an induced electromotive force caused by the measurement target current, enabling the measurement target current to be accurately detected even with the small size of the apparatus.

(2) The current measuring apparatus according to claim (1), characterized by further comprising the m measurement target conductors. Like the current measuring apparatus in (1), the current measuring apparatus provided with measurement target conductors such as bus bars can inhibit the possible adverse effect of a current in a different phase and the possible generation of an induced electromotive force caused by the measurement target current, enabling the measurement target current to be accurately detected even with the small size of the apparatus.

(3) The current measuring apparatus according to claim (1) or (2), characterized by further comprising a circuit board having a recessed portion into which the measurement target conductor is inserted and which has an inner surface abutting against a surface of the measurement target conductor and in that the two magnetic sensors are provided near the recessed portion. The arrangement in which the inner surface of the recessed portion abuts against the surface of the bus bar enables the circuit board to be reliably positioned with respect to the bus bar.

(4) The current measuring apparatus according to claim (1) or (2), characterized by further comprising a circuit board having a slot portion into which the measurement target conductor is inserted and which has an inner surface abutting against a surface of the measurement target conductor and in that the two magnetic sensors are provided near the slot portion. The arrangement in which the inner surface of the slot portion abuts against the surface of the bus bar enables the circuit board to be reliably positioned with respect to the bus bar.

(5) The current measuring apparatus according to claim (1) or (2), characterized in that the magnetic sensors are mounted on the circuit board, the circuit board has a circuit that processes a sensing output from the magnetic sensor to calculate a value for a current flowing through the measurement target conductor and a wire that electrically connects the magnetic sensors to the circuit, and the circuit board is positioned with respect to the measurement target conductor so that a circuit board surface with the wire provided thereon is positioned substantially parallel to the direction of the magnetic field. This makes it unlikely that an induced electromotive force is generated by an alternating current flowing through the conductor.

(6) The current measuring apparatus according to any one of claims (1) to (5), characterized by further including electromagnetic shield means provided on the conductor different from the measurement target conductor. Application of a magnetic shield such as winding of a magnetic substance or the like enables a further reduction in the adverse effect of a current flowing through the different conductor.

(7) The current measuring apparatus according to any one of claims (1) to (5), characterized in that the magnetic sensing direction of each of the magnetic sensors is such that the magnetic sensor is insensitive to a direction of a synthetic magnetic field generated by all currents flowing through a plurality of conductors different from the measurement target conductor. For example, the magnetic sensor is slightly inclined so as to be insensitive to the direction of the synthetic magnetic field by locating a magnetic sensing surface having the magnetic sensing direction corresponding to a normal direction, parallel to the direction of the synthetic magnetic field generated by a current flowing through the different conductor. This enables a further reduction in the adverse effect of a current flowing through the different conductor.

(8) The current measuring apparatus according to any one of claims (1) to (7), characterized in that each of the magnetic sensors has a Hall element. The Hall element enables the detection of the magnitude of a magnetic field including the direction of the magnetic field. This enables a reduction in the adverse effect of a disturbing magnetic field, allowing the measurement target current to be accurately measured.

INDUSTRIAL APPLICABILITY

The present invention makes it possible to inhibit the possible adverse effect of a current in a different phase and the possible generation of an induced electromotive force caused by a measurement target current, enabling the measurement target current to be accurately detected even with the small size of a relevant apparatus. The present invention can be preferably utilized in, for example, commercial three-phase alternating current measuring apparatuses and three-phase motor driving inverter apparatuses in order to measure a current while inhibiting the adverse effect of the current in a different phase.

The invention claimed is:

1. A current measuring apparatus comprising:
a plurality of planar conductors located parallel to each other with currents flowing through the plurality of planar conductors in an identical direction, the plurality of planar conductors including a measurement target conductor; and
a pair of magnetic sensors that senses a magnetic field generated by a current flowing through the measurement target conductor,
the magnetic sensors being located symmetrically with respect to the measurement target conductor, and being located at positions displaced from a center line in a width direction of the measurement target conductor,
the magnetic sensors sensing the magnetic field generated by the current flowing through the measurement target conductor, and not sensing magnetic fields generated by the currents flowing through the plurality of planar conductors except for the measurement target conductor.

2. The current measuring apparatus according to claim 1, wherein the pair of magnetic sensors are fixed to a circuit board located perpendicularly to the direction of the current, and the circuit board has a recessed portion or a slot portion into which the conductor is inserted for fixation.

3. The current measuring apparatus according to claim 1, wherein the circuit board has a signal processing integrated circuit that processes and converts sensing outputs from the magnetic sensors into a value for a current flowing through the measurement target conductor and a wiring section electrically connecting the magnetic sensors to the signal processing integrated circuit, and
the wiring section is formed parallel to a direction of the magnetic field.

4. The current measuring apparatus according to claim 1, further comprising electromagnetic shield means provided on the conductor different from the measurement target conductor.

5. The current measuring apparatus according to claim 1, wherein the magnetic sensing direction of each of the magnetic sensors is inclined through an angle such that the magnetic sensor is insensitive to a magnetic field generated by a current flowing through the adjacent conductor.

6. The current measuring apparatus according to claim 1, wherein the magnetic sensor includes a Hall element.

* * * * *